(12) United States Patent
Hachisuka et al.

(10) Patent No.: US 7,372,282 B2
(45) Date of Patent: *May 13, 2008

(54) METHOD AND APPARATUS FOR TESTING TUNNEL MAGNETORESISTIVE EFFECT ELEMENT, MANUFACTURING METHOD OF TUNNEL MAGNETORESISTIVE EFFECT ELEMENT AND TUNNEL MAGNETORESISTIVE EFFECT ELEMENT

(75) Inventors: Nozomu Hachisuka, Tokyo (JP); Hiroshi Kiyono, Tokyo (JP); Takeo Kagami, Tokyo (JP); Kenji Inage, Tokyo (JP); Norio Takahashi, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/276,753

(22) Filed: Mar. 13, 2006

(65) Prior Publication Data

US 2006/0216837 A1     Sep. 28, 2006

(30) Foreign Application Priority Data

Mar. 25, 2005   (JP) .............................. 2005-088304

(51) Int. Cl.
*G01R 27/08*   (2006.01)
*H01L 21/66*   (2006.01)

(52) U.S. Cl. .................... 324/691; 324/719; 324/230; 438/14; 438/18

(58) Field of Classification Search ................ 324/691, 324/230, 719; 338/32 R; 360/324.2
See application file for complete search history.

(56) References Cited

U.S. PATENT DOCUMENTS

| | | | | |
|---|---|---|---|---|
| 3,256,483 | A | * | 6/1966 | Broadbent ................. 324/693 |
| 6,067,200 | A | * | 5/2000 | Ohba et al. .................. 360/66 |
| 6,473,257 | B1 | | 10/2002 | Shimazawa et al. |
| 6,927,569 | B2 | * | 8/2005 | Worledge et al. ........... 324/230 |
| 2002/0154540 | A1 | * | 10/2002 | Sekiguchi et al. .......... 365/171 |

* cited by examiner

*Primary Examiner*—Vincent Q. Nguyen
(74) *Attorney, Agent, or Firm*—Oblon, Spivak, McClelland, Maier & Neustadt, P.C.

(57) ABSTRACT

A method for testing a TMR element includes a step of measuring a plurality of resistances of the TMR element by applying a plurality of voltages with different voltage values each other to the TMR element, respectively, a step of calculating a ratio of change in resistance from the measured plurality of resistances of the TMR element, and a step of evaluating the TMR element using the calculated ratio of change in resistance.

48 Claims, 10 Drawing Sheets

METHOD AND APPARATUS FOR TESTING TUNNEL MAGNETORESISTIVE EFFECT ELEMENT, MANUFACTURING METHOD OF TUNNEL MAGNETORESISTIVE EFFECT ELEMENT AND TUNNEL MAGNETORESISTIVE EFFECT ELEMENT

PRIORITY CLAIM

This application claims priority from Japanese patent application No.2005-088304, filed on Mar. 25, 2005, which is incorporated herein by reference.

BACKGROUND OF THE INVENTION

1. Field of the Invention

The present invention relates to a method and apparatus for testing a tunnel magnetoresistive effect (TMR) element such as a TMR read head element using the tunnel magnetoresistive effect or a magnetoresistive random access memory (MRAM) cell, to a manufacturing method of a TMR element, and to a TMR element.

2. Description of the Related Art

An evaluation test of a thin-film magnetic head with a TMR read head element is in general performed for determining whether or not the thin-film magnetic head is a non-defective product, during or after manufacturing the magnetic head. This evaluation test includes a reliability test for confirming that a breakdown voltage of the TMR head element is sufficiently high to withstand an extended period of use.

U.S. Pat. No. 6,473,257 discloses a testing method for confirming a reliability of a TMR read head element without damaging or breaking the TMR read head element. In this testing method, a performance of the TMR read head element such as its electromagnetic conversion performance is measured by using a test current with a predetermined current value. The test current value is determined by measuring a resistance of the TMR read head element when a predetermined initial current is flowing there through, or determined by repeatedly measuring a modified current when a reference voltage is applied to the TMR read head element and by measuring a resistance of the TMR read head element when the finally measured modified current is flowing there through.

However, this testing method disclosed in U.S. Pat. No. 6,473,257 requires a performance test of the TMR read head element such as an electromagnetic conversion performance test of the TMR read head element, and thus requires a great deal of expense in manpower and in time for confirming a reliability.

In order to solve such disadvantages in the prior art testing method, the inventors of this application have proposed, in U.S. patent Ser. No. 11/130,258, filed on May 17, 2005 a testing method of a TMR element. In the proposed method, constant currents with different current values are fed through the TMR element, an output voltage of the TMR element is measured for each current, a resistance of the TMR element is calculated for each current, and then the ratio of change in the resistances dMRR(%) is calculated.

According to this testing method proposed, reliability of the TMR elements can be easily confirmed in a short period of time. However, because the ratio of change in the resistances dMRR(%) has extremely strong correlation to the resistance of the TMR element and also there are mixed influences of film area and film material, it is difficult to clearly judge whether the TMR element is good product or not with reliability.

BRIEF SUMMARY OF THE INVENTION

It is therefore an object of the present invention to provide a method and apparatus for testing a TMR element, a manufacturing method of a TMR element, and a TMR element, whereby a reliability of the TMR element can be quickly and easily confirmed without failing.

According to the present invention, a method for testing a TMR element includes a step of measuring a plurality of resistances of the TMR element by applying a plurality of voltages with different voltage values each other to the TMR element, respectively, a step of calculating a ratio of change in resistance VbdMRR(%) from the measured plurality of resistances of the TMR element, and a step of evaluating the TMR element using the calculated ratio of change in resistance VbdMRR(%).

In this case, it is preferred that the measuring step includes applying a plurality of discontinuous voltages with different voltage values each other to the TMR element. Discontinuous application of voltages means that one voltage is applied and then stopped, and thereafter another voltage is applied.

It is also preferred that the measuring step includes measuring two resistances of the TMR element by applying two voltages with different voltage values each other to the TMR element, and that the calculating step includes calculating a ratio of change in resistance VbdMRR(%) from a difference between the measured two resistances of the TMR element.

According to the present invention, also, a method for testing a TMR element includes a step of measuring a first resistance of the TMR element by applying a voltage with a first voltage value to the TMR element, and a second resistance of the TMR element by applying a voltage with a second voltage value of which absolute value is greater than that of the first voltage value to the TMR element, a step of calculating a ratio of change in resistance VbdMRR(%) from the measured first and second resistances of the TMR element, and a step of evaluating the TMR element using the calculated ratio of change in resistance VbdMRR(%).

A plurality of voltages with different voltage values are applied to the TMR element and the resistances of the TMR element at the respective different voltage values are measured to calculate a ratio of change in resistance VbdMRR (%). The calculated ratio of change in resistance VbdMRR (%) is used for evaluating the TMR element. This measurement, calculation and evaluation are performed for every TMR element. Element breakdown voltages of TMR elements having lower ratios of change in resistance VbdMRR(%) are higher than that of TMR elements having higher ratios of change in resistance VbdMRR(%). Therefore, measurement of resistances by applying voltages with different voltage values and calculation of a ratio of change in resistance VbdMRR(%) from thus measured resistances allow confirmation of reliability of the TMR element. Also, this evaluation test of non-defective and defective products can be extremely easily and quickly performed. Furthermore, because the evaluation test can be performed without destroying the TMR element, 100% inspection of the manufactured TMR elements becomes possible. As a result, a reliability of the TMR element can be quickly and easily confirmed without failing, and thus it is extremely effective for mass-production. Particularly, because the constant voltages with the different voltage values are applied to the TMR element, load applied to the different size tunnel barrier layers become equal to each other resulting that measurement and evaluation can be performed with keeping a load factor constant. Also, the measurement can be performed under the state closed to that in which the TMR elements are actually operated.

Namely, according to the present invention, the resistance change ratio VbdMRR(%) does not have a strong correlation with the resistance of the TMR element and, when the ratio VbdMRR(%) approaches a certain value, no area effect due to the size of the tunnel barrier layer is obtained resulting that it becomes easier to evaluate whether the tunnel barrier layer of the TMR element functions well or malfunctions. In other words, an inclination of a single continuous correlation line that represents a relationship between the resistance and the resistance change ratio VbdMRR(%) of the TMR element is large and the resistance change ratio VbdMRR(%) is decreased in a region in which the resistance is lower than a threshold, whereas the correlation line inflects to change its inclination and approaches a certain resistance change ratio VbdMRR(%) to be saturated in a region in which the resistance is equal to or higher than the threshold. The tunnel barrier layer of the TMR element shows different characteristics between the region wherein the resistance is low and the correlation line has a large negative inclination and the region wherein the correlation line inflects and approaches the certain resistance change ratio. As a result, according to the present invention, it is possible to clearly and certainly confirm a reliability of the TMR element without failing.

It is preferred that the measuring step includes applying the voltage with the second voltage value, which is discontinuous to the voltage with the first voltage value, to the TMR element. Discontinuous application of voltages means that one voltage is applied and then stopped, and thereafter another voltage is applied.

It is also preferred that the calculating step includes calculating the ratio of change in resistance VbdMRR(%) from a difference between the measured first and second resistances.

It is further preferred that the calculating step includes calculating the ratio of change in resistance VbdMRR(%) from an expression of VbdMRR(%)=$(R_2-R_1)/R_1 \times 100$ (%), where the first resistance is indicated by $R_1$ and the second resistance is indicated by $R_2$.

It is still further preferred that the evaluating step includes evaluating the TMR element as a non-defective product when the calculated ratio of change in resistance VbdMRR (%)=$(R_2-R_1)/R_1 \times 100$ (%) is less than a predetermined threshold.

It is preferred that the TMR element has a tunnel barrier layer made of an oxide of aluminum, that the measuring step includes applying the voltage with the first voltage value of 25 mV to the TMR element, and applying the voltage with the second voltage value of 150 mV to the TMR element, and that the predetermined threshold is −0.9 (%). In case that the tunnel barrier layer of the TMR element is made of a material other than the oxide of aluminum, it is possible to similarly evaluate the TMR element by correspondingly determining a first voltage value and a second voltage value and a threshold of the resistance change ratio VbdMRR(%).

It is preferred that the measuring step includes applying an external DC magnetic field in a predetermined direction to the TMR element so that the measuring step is performed under the applied external DC magnetic field.

It is preferred that the TMR element is a TMR head element or an MRAM cell.

According to the present invention, further, an apparatus for testing a TMR element includes a unit for measuring a first resistance of the TMR element by applying a voltage with a first voltage value to the TMR element, and a second resistance of the TMR element by applying a voltage with a second voltage value of which absolute value is greater than that of the first voltage value to the TMR element, a unit for calculating a ratio of change in resistance VbdMRR(%) from the measured first and second resistances of the TMR element, and a unit for evaluating the TMR element using the calculated ratio of change in resistance VbdMRR(%).

A plurality of voltages with different voltage values are applied to the TMR element and the resistances of the TMR element at the respective different voltage values are measured to calculate a ratio of change in resistance VbdMRR (%). The calculated ratio of change in resistance VbdMRR (%) is used for evaluating the TMR element. This measurement, calculation and evaluation are performed for every TMR element. Element breakdown voltages of TMR elements having lower ratios of change in resistance Vbd-MRR(%) are higher than that of TMR elements having higher ratios of change in resistance VbdMRR(%). Therefore, measurement of resistances by applying voltages with different voltage values and calculation of a ratio of change in resistance VbdMRR(%) from thus measured resistances allow confirmation of reliability of the TMR element. Also, this evaluation test of non-defective and defective products can be extremely easily and quickly performed. Furthermore, because the evaluation test can be performed without destroying the TMR element, 100% inspection of the manufactured TMR elements becomes possible. As a result, a reliability of the TMR element can be quickly and easily confirmed without failing, and thus it is extremely effective for mass-production. Particularly, because the constant voltages with the different voltage values are applied to the TMR element, load applied to the different size tunnel barrier layers become equal to each other resulting that measurement and evaluation can be performed with keeping a load factor constant. Also, the measurement can be performed under the state closed to that in which the TMR elements are actually operated.

Namely, according to the present invention, the resistance change ratio VbdMRR(%) does not have a strong correlation with the resistance of the TMR element and, when the ratio VbdMRR(%) approaches a certain value, no area effect due to the size of the tunnel barrier layer is obtained resulting that it becomes easier to evaluate whether the tunnel barrier layer of the TMR element functions well or malfunctions. In other words, an inclination of a single continuous correlation line that represents a relationship between the resistance and the resistance change ratio VbdMRR(%) of the TMR element is large and the resistance change ratio VbdMRR(%) is decreased in a region in which the resistance is lower than a threshold, whereas the correlation line inflects to change its inclination and approaches a certain resistance change ratio to be saturated in a region in which the resistance is equal to or higher than the threshold. The tunnel barrier layer of the TMR element shows different characteristics between the region wherein the resistance is low and the correlation line has a large negative inclination and the region wherein the correlation line inflects and approaches the certain resistance change ratio. As a result, according to the present invention, it is possible to clearly and certainly confirm a reliability of the TMR element without failing.

It is preferred that the measuring unit includes a unit for applying the voltage with the second voltage value, which is discontinuous to the voltage with the first voltage value, to the TMR element. Discontinuous application of voltages means that one voltage is applied and then stopped, and thereafter another voltage is applied.

It is also preferred that the calculating unit includes a unit for calculating the ratio of change in resistance VbdMRR (%) from a difference between the measured first and second resistances.

It is further preferred that the calculating unit includes a unit for calculating the ratio of change in resistance VbdMRR(%) from an expression of VbdMRR(%)=$(R_2-R_1)/R_1 \times 100$ (%), where the first resistance is indicated by $R_1$ and the second resistance is indicated by $R_2$.

It is also preferred that the evaluating unit includes a unit for evaluating the TMR element as a non-defective product when the calculated ratio of change in resistance VbdMRR (%)=$(R_2-R_1)/R_1 \times 100$ (%) is less than a predetermined threshold.

It is preferred that the TMR element has a tunnel barrier layer made of an oxide of aluminum, that the measuring unit includes a unit for applying the voltage with the first voltage value of 25 mV to the TMR element, and applying the voltage with the second voltage value of 150 mV to the TMR element, and that the predetermined threshold is −0.9 (%). In case that the tunnel barrier layer of the TMR element is made of a material other than the oxide of aluminum, it is possible to similarly evaluate the TMR element by correspondingly determining a first voltage value and a second voltage value and a threshold of the resistance change ratio VbdMRR(%).

It is preferred that the measuring unit includes a unit for applying an external DC magnetic field in a predetermined direction to the TMR element so that the measurement is performed under the applied external DC magnetic field.

It is preferred that the TMR element is a TMR head element or an MRAM cell.

According to the present invention, a manufacturing method of a TMR element includes a wafer process for forming many thin-film TMR elements on a wafer, a cut process for cutting the wafer into a plurality of bar members, each of the bar members having the aligned TMR elements, a measurement process for measuring a first resistance of the TMR element to be tested on the bar member by applying a voltage with a first voltage value to the TMR element, and a second resistance of the TMR element by applying a voltage with a second voltage value of which absolute value is greater than that of the first voltage value to the TMR element, a calculation process for calculating a ratio of change in resistance VbdMRR(%) from the measured first and second resistances of each TMR element, an evaluation process for evaluating each TMR element using the calculated ratio of change in resistance VbdMRR(%), and a separation process for cutting the evaluated bar member into individual magnetic head sliders, each individual magnetic head slider having the TMR element.

According to the present invention, also, a manufacturing method of a TMR element includes a wafer process for forming many thin-film TMR elements on a wafer, a measurement process for measuring a first resistance of the TMR element to be tested on the wafer by applying a voltage with a first voltage value to the TMR element, and a second resistance of the TMR element by applying a voltage with a second voltage value of which absolute value is greater than that of the first voltage value to the TMR element, a calculation process for calculating a ratio of change in resistance VbdMRR(%) from the measured first and second resistances of each TMR element, an evaluation process for evaluating each TMR element using the calculated ratio of change in resistance VbdMRR(%), a cut process for cutting the evaluated wafer into a plurality of bar members, each of the bar members having the aligned TMR elements, and a separation process for cutting each bar member into individual magnetic head sliders, each individual magnetic head slider having the TMR element.

According to the present invention, further, a manufacturing method of a TMR element includes a wafer process for forming many thin-film TMR elements on a wafer, a cut process for cutting the wafer into a plurality of bar members, each of the bar members having the aligned TMR elements, a separation process for cutting each of the bar members into individual magnetic head sliders, each individual magnetic head slider having the TMR element, a measurement process for measuring a first resistance of the TMR element to be tested by applying a voltage with a first voltage value to the TMR element, and a second resistance of the TMR element by applying a voltage with a second voltage value of which absolute value is greater than that of the first voltage value to the TMR element, a calculation process for calculating a ratio of change in resistance VbdMRR(%) from the measured first and second resistances of the TMR element, and an evaluation process for evaluating the TMR element using the calculated ratio of change in resistance VbdMRR(%).

A plurality of voltages with different voltage values are applied to the TMR element and the resistances of the TMR element at the respective different voltage values are measured to calculate a ratio of change in resistance VbdMRR (%). The calculated ratio of change in resistance VbdMRR (%) is used for evaluating the TMR element. This measurement, calculation and evaluation are performed for every TMR element. Element breakdown voltages of TMR elements having lower ratios of change in resistance VbdMRR(%) are higher than that of TMR elements having higher ratios of change in resistance VbdMRR(%). Therefore, measurement of resistances by applying voltages with different voltage values and calculation of a ratio of change in resistance VbdMRR(%) from thus measured resistances allow confirmation of reliability of the TMR element. Also, this evaluation test of non-defective and defective products can be extremely easily and quickly performed. Furthermore, because the evaluation test can be performed without destroying the TMR element, 100% inspection of the manufactured TMR elements becomes possible. As a result, a reliability of the TMR element can be quickly and easily confirmed without failing, and thus it is extremely effective for mass-production. Particularly, because the constant voltages with the different voltage values are applied to the TMR element, load applied to the different size tunnel barrier layers become equal to each other resulting that measurement and evaluation can be performed with keeping a load factor constant. Also, the measurement can be performed under the state closed to that in which the TMR elements are actually operated.

Namely, according to the present invention, the resistance change ratio VbdMRR(%) does not have a strong correlation with the resistance of the TMR element and, when the ratio VbdMRR(%) approaches a certain value, no area effect due to the size of the tunnel barrier layer is obtained resulting that it becomes easier to evaluate whether the tunnel barrier layer of the TMR element functions well or malfunctions. In other words, an inclination of a single continuous correlation line that represents a relationship between the resistance and the resistance change ratio VbdMRR(%) of the TMR element is large and the resistance change ratio VbdMRR(%) is decreased in a region in which the resistance is lower than a threshold, whereas the correlation line inflects to change its inclination and approaches a certain resistance change ratio to be saturated in a region in which the resistance is equal to or higher than the threshold. The tunnel barrier layer of the TMR element shows different characteristics between the region wherein the resistance is low and the correlation line has a large negative inclination and the region wherein the correlation line inflects and approaches the certain resistance change ratio. As a result, according to the present invention, it is possible to clearly and certainly confirm a reliability of the TMR element without failing.

It is preferred that the measurement process includes applying the voltage with the second voltage value, which is discontinuous to the voltage with the first voltage value, to the TMR element. Discontinuous application of voltages means that one voltage is applied and then stopped, and thereafter another voltage is applied.

It is also preferred that the calculation process includes calculating the ratio of change in resistance VbdMRR(%) from a difference between the measured first and second resistances.

It is further preferred that the calculation process includes calculating the ratio of change in resistance VbdMRR(%) from an expression of $VbdMRR(\%)=(R_2-R_1)/R_1 \times 100$ (%), where the first resistance is indicated by $R_1$ and the second resistance is indicated by $R_2$.

It is also preferred that the evaluation process includes evaluating the TMR element as a non-defective product when the calculated ratio of change in resistance VbdMRR (%)=$(R_2-R_1)/R_1 \times 100$ (%) is less than a predetermined threshold.

It is further preferred that the TMR element has a tunnel barrier layer made of an oxide of aluminum, that the measurement process includes applying the voltage with the first voltage value of 25 mV to the TMR element, and applying the voltage with the second voltage value of 150 mV to the TMR element, and that the predetermined threshold is −0.9 (%). In case that the tunnel barrier layer of the TMR element is made of a material other than the oxide of aluminum, it is possible to similarly evaluate the TMR element by correspondingly determining a first voltage value and a second voltage value and a threshold of the resistance change ratio.

It is preferred that the measuring process includes applying an external DC magnetic field in a predetermined direction to the TMR element so that the measurement is performed under the applied external DC magnetic field.

It is preferred that the TMR element is a TMR head element or an MRAM cell.

According to the present invention, also, a TMR element manufactured by the above-mentioned manufacturing methods is provided.

It is preferred that the TMR element has a tunnel barrier layer made of an oxide of aluminum (Al) such as for example $Al_2O_3$.

Further objects and advantages of the present invention will be apparent from the following description of the preferred embodiments of the invention as illustrated in the accompanying drawings.

DETAILED DESCRIPTION OF THE INVENTION

Figure 1:
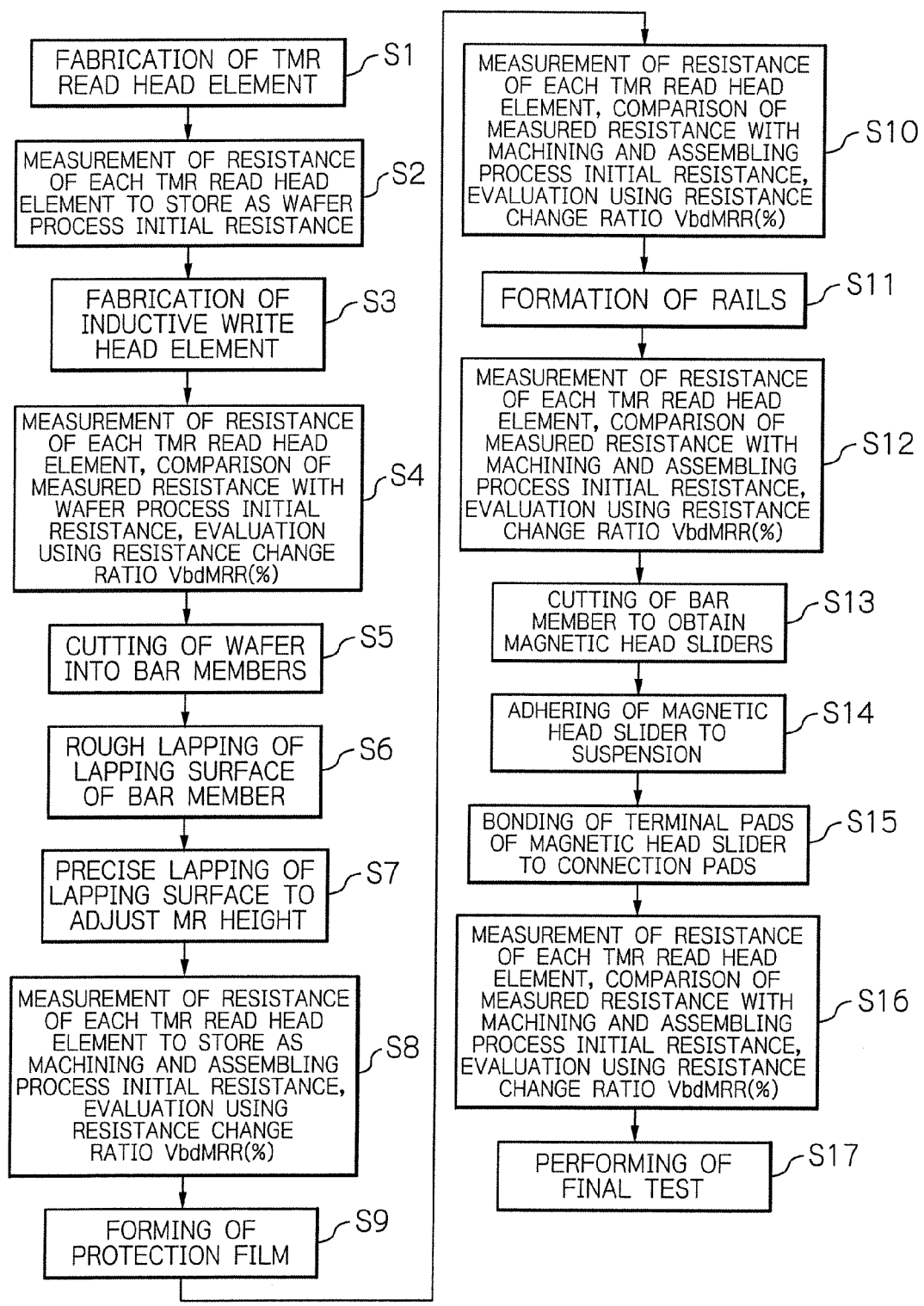
FIG. 1 is a flow chart schematically illustrating a wafer process for fabricating thin-film magnetic heads with TMR read head elements and an assembling process for forming head gimbal assemblies (HGAs) as a preferred embodiment according to the present invention.

FIG. 1 schematically illustrates a wafer process for fabricating thin-film magnetic heads with TMR read head elements and an assembling process for forming HGAs as a preferred embodiment according to the present invention, and FIGS. 2a to 2d illustrate a part of the processes shown in FIG. 1.

First, many TMR read head elements such as TMR read head elements for longitudinal magnetic recording or perpendicular magnetic recording are formed in matrix on a thin-film integration surface of a wafer for thin-film (Step S1).

Figure 3:
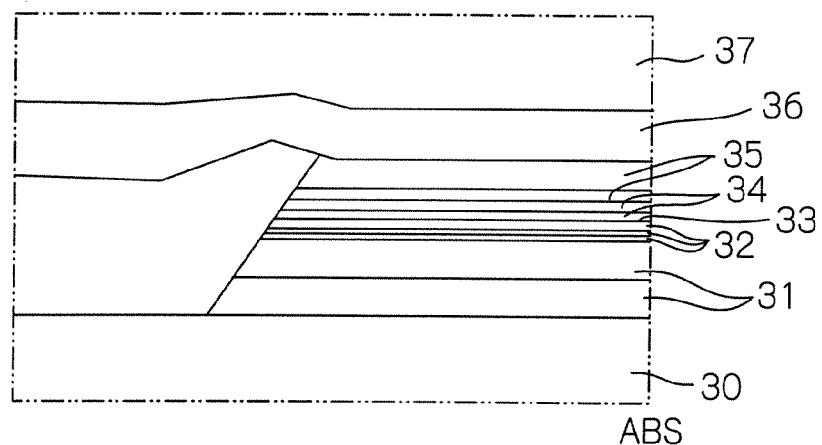
FIG. 3 is a sectional view, seen along a direction orthogonal to an air-bearing surface (ABS) of the head element, illustrating an example structure of each TMR read head element fabricated by the manufacturing method of the embodiment of FIG. 1.
Figure 4:
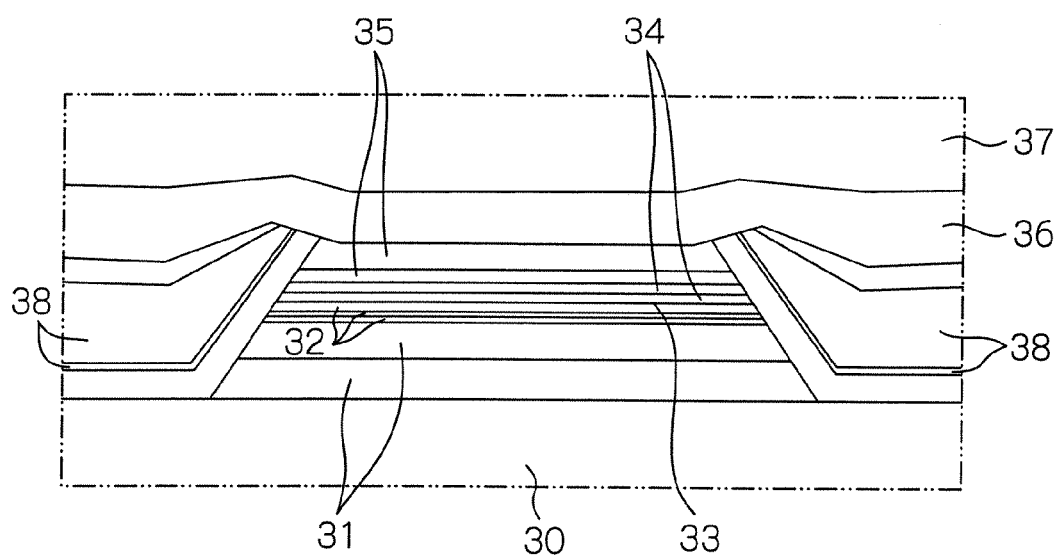
FIG. 4 is a sectional view, seen from the ABS, illustrating the TMR read head element of FIG. 3.

FIGS. 3 and 4 illustrate an example structure of each TMR read head element thus formed. FIG. 3 shows a section seen along a direction orthogonal to the ABS of the TMR read head element and FIG. 4 shows a section seen from the ABS.

As shown in FIGS. 3 and 4, a TMR film of the TMR read head element has a multilayered structure of an anti-ferromagnetic layer (pin layer) 31, a pined layer 32, a tunnel barrier layer 33, a free layer 34 and a cap layer 35 sequentially laminated on a lower shield and electrode layer 30. On the TMR film, a metal gap layer 36 and an upper shield and electrode layer 37 are laminated. Bias layers 38 are formed in lateral regions located in the track-width direction of the TMR film. In modifications, the order of lamination of the TMR multi-layers may be in inverse. The tunnel barrier layer 33 is made of oxide of Al, Ti, Zr, Hf, Ta, Mg or else.

Then, a resistance of each TMR read head element is measured (Step S2). The resistance is measured using a test apparatus that will be mentioned later by bringing two pairs of probes into electrical contact with terminal pads of each TMR read head element in the wafer, (1) applying a voltage with a first voltage value of for example 25 mV to the TMR read head element from a constant voltage supply and measuring its output current flowing there through by a current meter to calculate the resistance of the TMR read head element, or (2) feeding a current with a known current value through the TMR read head element from a constant current supply and monitoring its output voltage by a voltage meter to know a constant current value at which the output voltage becomes the first voltage value of for example 25 mV so as to calculate the resistance of the TMR read head element. Namely, in this embodiment, the resistance of the TMR read head element is calculated from the value of current flowing through the TMR read head element when the first voltage of for example 25 mV is applied to the TMR read head element. Each calculated resistance is stored in the test apparatus as a wafer process initial resistance $R_0$.

Figure 2A:
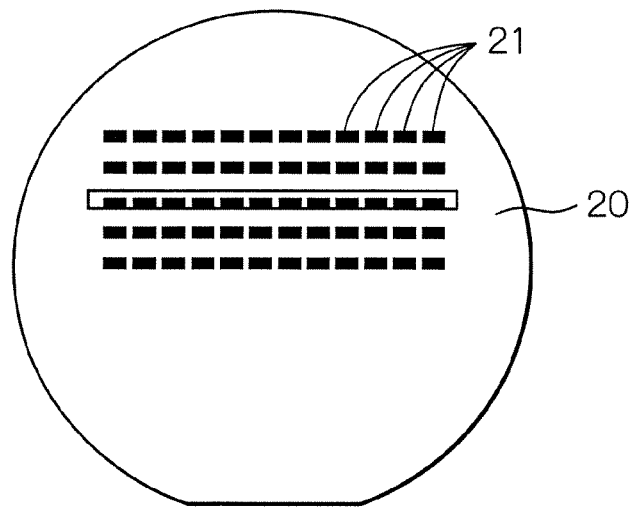
FIGS. 2a to 2d are views illustrating a part of the processes shown in FIG. 1.

Thereafter, inductive write head elements are formed on the respective TMR read head elements (Step S3). FIG. 2a illustrates a wafer 20 on which many thin-film magnetic head elements 21 consisting of the TMR read head elements and the inductive write head elements are thus formed in matrix.

After forming the inductive write head elements on the wafer, a resistance of each TMR read head element is measured and also a ratio of change in resistance VbdMRR (%) of each TMR read head element is obtained (Step S4). The resistance is measured using the test apparatus by bringing the pair of probes into electrical contact with terminal pads of each TMR read head element in the wafer, (1) applying a voltage with the first voltage value of for example 25 mV to the TMR read head element from the constant voltage supply and measuring its output current flowing there through by the current meter to calculate the resistance of the TMR read head element, or (2) feeding a current with a known current value through the TMR read head element from the constant current supply and monitoring its output voltage by the voltage meter to know a constant current value at which the output voltage becomes the first voltage value of for example 25 mV so as to calculate the resistance of the TMR read head element. Namely, in this embodiment, the resistance of the TMR read head element is calculated from the value of current flowing through the TMR read head element when the first voltage of for example 25 mV is applied to the TMR read head element. Each calculated resistance is stored in the test apparatus as a first resistance $R_1$.

The ratio of change in resistance VbdMRR(%) is obtained using the test apparatus as follows. After calculating the first resistance $R_1$, another resistance of the TMR read head element is calculated from the value of current flowing through the TMR read head element when a voltage with a second voltage value of for example 150 mV, which voltage is discontinuous from the former voltage with the first voltage value and having the second voltage value higher than the first voltage value, is applied to the TMR read head element. The calculated resistance at this time is stored in the test apparatus as a second resistance $R_2$. Then, the resistance change ratio VbdMRR(%) is calculated from VbdMRR(%)= $(R_2-R_1)/R_1 \times 100$. The calculated ratio VbdMRR(%) is stored in the test apparatus. In this specification, "discontinuous" application of voltage means that one voltage is applied and then stopped, and thereafter another voltage is applied. Contrary to this, "continuous" application of voltage means that one voltage is applied and then the other voltage is applied without stopping the application of the former voltage until start of the later voltage application. In the present invention, it is preferred that the voltage with the second voltage value is applied discontinuously with respect to the voltage with the first voltage value. However, in modifications, the later voltage may be applied continuously with respect to the former voltage.

At Step S4, further, the first resistance $R_1$ obtained at that time is compared with the wafer process initial resistance $R_0$ obtained at Step S2. If there is a difference in resistances, it is considered that the resistance of the barrier layer 33 of the TMR read head element has changed during the forming process of the inductive write head elements. This change in resistance of the barrier layer 33 may be caused by increased mobility in oxygen or by physical damage. In such case, a degree of metallic conduction in the barrier layer is evaluated from the resistance change ratio VbdMRR(%). This evaluation is performed in this embodiment by judging whether the calculated resistance change ratio VbdMRR(%) is less than a predetermined threshold of −0.9 (%) or not, namely whether the ratio VbdMRR(%) is negative and its absolute value is more than 0.9 (%) or not.

The process of the above-mentioned Steps S1-S4 is the wafer process.

Figure 2B:
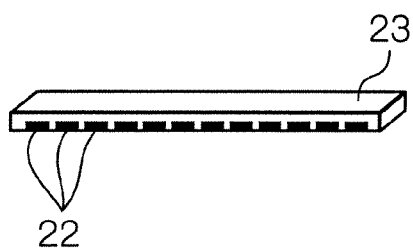
Figure 2C:
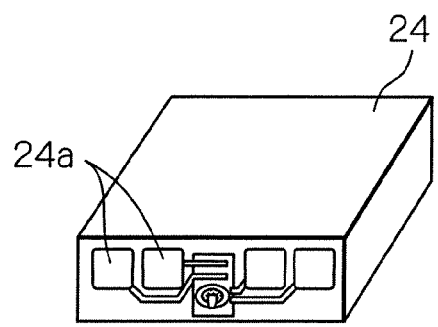

Thereafter, the wafer 20 is cut into a plurality of bar members or row bars 23 each of which has a plurality of thin-film magnetic heads 22 aligned along the bar member (Step S5). FIG. 2b illustrates thus formed bar member 23.

Then, a lapping surface of this bar member 23 located at the ABS side is roughly lapped (Step S6), and then this lapping surface is precisely lapped to adjust the MR height (Step S7).

Thereafter, a resistance of each TMR read head element is measured and also a ratio of change in resistance VbdMRR(%) of each TMR read head element is obtained (Step S8). The resistance and the ratio of change in resistance VbdMRR(%) are obtained in the similar manner as done at Step S4. However, at Step S8, the calculated first resistance $R_1$ is also stored in the test apparatus as a machining and assembling process initial resistance $R_0'$. At Step S8, furthermore, each TMR read head element is evaluated by judging whether the calculated resistance change ratio VbdMRR(%) is less than a predetermined threshold of −0.9 (%) or not, namely whether the ratio dMRR(%) is negative and its absolute value is more than 0.9 (%) or not. If the ratio VbdMRR(%) is less than the threshold of −0.9 (%), a degree of metallic conduction in the barrier layer is low and thus it is evaluated that this TMR read head element is non-defective product with a high element breakdown voltage. Whereas, if the ratio VbdMRR(%) is equal to or more than the threshold of −0.9 (%), the lapping may inflict damage to the TMR read head element to provide a high metallic conduction in the barrier layer due to occurrence of pinholes or provide a short-circuit around the barrier layer due to flaws or scratches (smears) occurred by lapping, and thus it is evaluated that this TMR read head element is defective product with the metallic conduction or with a low element breakdown voltage.

For the TMR read head elements with resistance change ratios VbdMRR(%) after lapping being less than −0.9 (%), it is possible to confirm, from an average value of their resistances, whether a target MR height is attained or not, and also it is possible to estimate, from the resistance value distribution of the TMR read head elements on the bar member, a distribution and a deviation of MR height adjusted amounts of these TMR read head elements.

In case that resistance change ratios VbdMRR(%) after lapping are equal to or more than −0.9 (%), lapping conditions may be modified. It is possible to control time duration and condition of the etching or milling process for recovering from short-circuit by monitoring whether the resistance change ratio VbdMRR(%) becomes less than −0.9 (%) or not.

Then, a protection film is formed on the lapped surface of the bar member (Step S9).

Thereafter, a resistance of each TMR read head element is measured and also a ratio of change in resistance VbdMRR(%) of each TMR read head element is obtained (Step S10). The resistance and the ratio of change in resistance VbdMRR(%) are obtained in the similar manner as done at Step S4. At Step S10, the first resistance $R_1$ obtained at this Step S10 and the machining and assembling process initial resistance $R_0'$ obtained at Step S8 are compared with each other. If there is a difference in resistances, it is considered that the resistance of the tunnel barrier layer 33 of the TMR read head element has changed by damage due to ion milling or oxidization after the lapping process. In such case, a degree of metallic conduction in the barrier layer is evaluated from the resistance change ratio VbdMRR(%). This evaluation is performed in this embodiment by judging whether the calculated resistance change ratio VbdMRR(%) is less than a predetermined threshold of −0.9 (%) or not, namely whether the ratio dMRR(%) is negative and its absolute value is more than 0.9 (%) or not. If the ratio VbdMRR(%) is less than the threshold of −0.9 (%), a degree of metallic conduction in the barrier layer is low and thus it is evaluated that this TMR read head element is non-defective product with a high element breakdown voltage. Whereas, if the ratio VbdMRR(%) is equal to or more than the threshold of −0.9 (%), the ion milling or oxidization may inflict damage to the TMR read head element to provide a high metallic conduction in the barrier layer due to occurrence of pinholes, and thus it is evaluated that this TMR read head element is defective product with a low element breakdown voltage.

Then, on the surface of the ABS side of the bar member, rails are formed by ion milling or else (Step S11).

Thereafter, a resistance of each TMR read head element is measured and also a ratio of change in resistance VbdMRR(%) of each TMR read head element is obtained (Step S12). The resistance and the ratio of change in resistance VbdMRR(%) are obtained in the similar manner as done at Step S4. At Step S12, the first resistance $R_1$ obtained at this Step S12 and the machining and assembling process initial resistance $R_0'$ obtained at Step S8 are compared with each other. If there is a difference in resistances, it is considered that the resistance of the tunnel barrier layer 33 of the TMR read head element has changed by damage due to ion milling at the rail forming process. In such case, a degree of metallic conduction in the barrier layer is evaluated from the resistance change ratio VbdMRR(%). This evaluation is performed in this embodiment by judging whether the calculated resistance change ratio VbdMRR(%) is less than a predetermined threshold of −0.9 (%) or not, namely whether the ratio VbdMRR(%) is negative and its absolute value is more than 0.9 (%) or not. If the ratio VbdMRR(%) is less than the threshold of −0.9 (%), a degree of metallic conduction in the barrier layer is low and thus it is evaluated that this TMR read head element is non-defective product with a high element breakdown voltage. Whereas, if the ratio VbdMRR(%) is equal to or more than the threshold of −0.9 (%), the ion milling may inflict damage to the TMR read head element to provide a high metallic conduction in the barrier layer due to occurrence of pinholes, and thus it is evaluated that this TMR read head element is defective product with a low element breakdown voltage.

Then, the bar member 23 is cut and separated into a plurality of individual magnetic head sliders 24 (Step S13). FIG. 2b illustrates each separated magnetic head slider 24.

The process of the above-mentioned Steps S5-S13 is the machining process.

Thereafter, the magnetic head slider 24 is adhered to a suspension 25 to form an HGA 26 (Step S14), and then terminal pads 24a of the magnetic head slider 24 are bonded to connection pads of a wiring member formed or attached on the suspension 25 (Step S15).

Figure 2D:
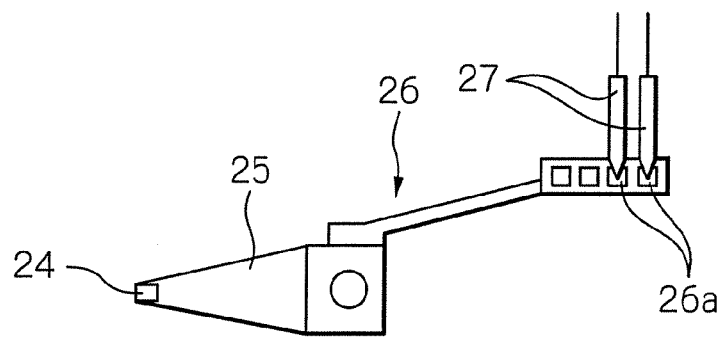
Figure 5:
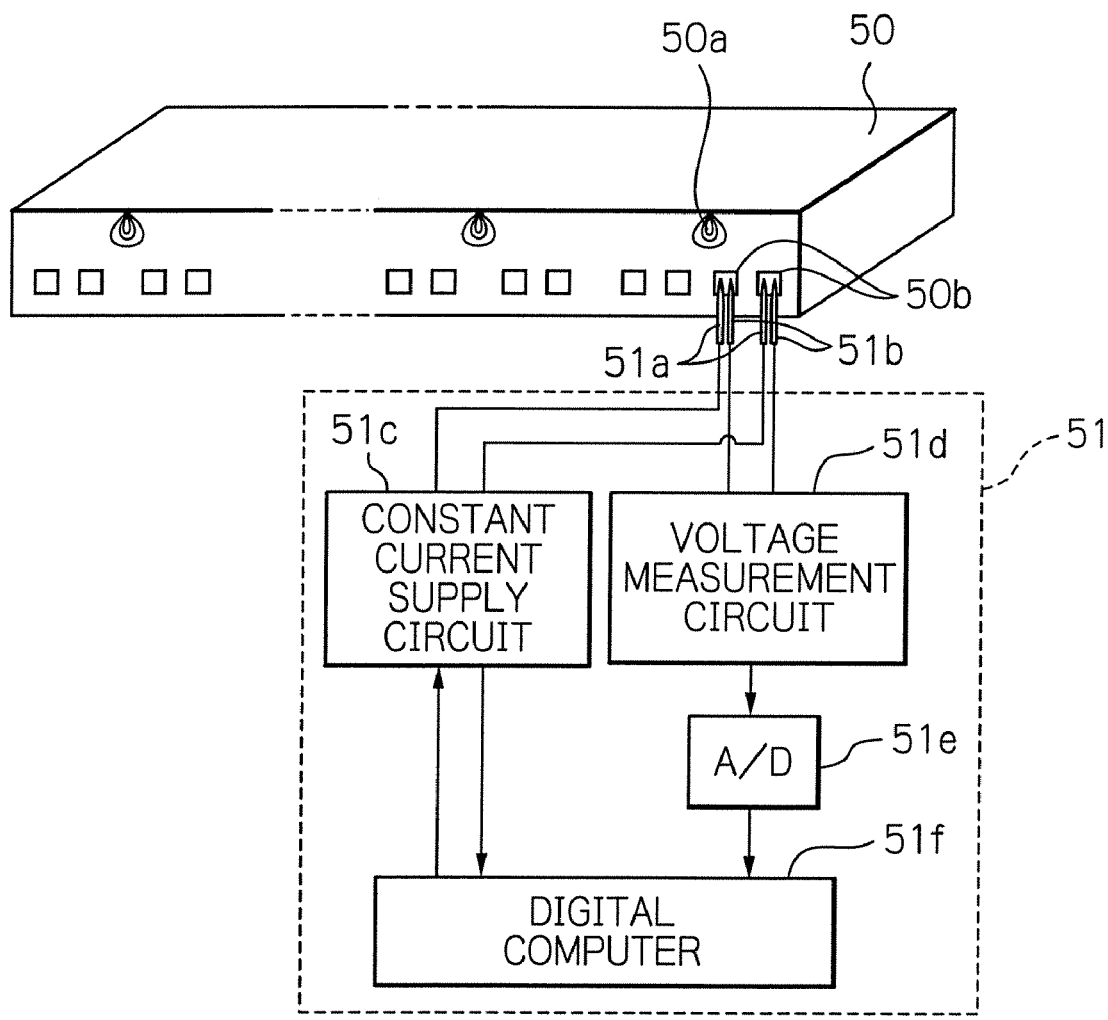
FIG. 5 is a view schematically illustrating a partial configuration of testing a TMR read head element in the embodiment of FIG. 1.

Then, a resistance of the TMR read head element is measured and also a ratio of change in resistance VbdMRR (%) of the TMR read head element is obtained (Step S16). The resistance is measured, by bringing two pairs of probes 27 into electrical contact with external connection pads 26a electrically connected to the connection pads of the HGA in the similar manner as done at Step S4, and also the ratio of change in resistance VBdMRR(%) is calculated. Although only a one pair of probes 27 is illustrated in FIG. 2d, because the resistance is measured by the four-terminal measurement method in actual, two pairs of probes are used as illustrated in FIG. 5. At Step S16, the first resistance $R_1$ obtained at this Step S16 and the machining and assembling process initial resistance $R_0'$ obtained at Step S8 are compared with each other. If there is a difference in resistances, it is considered that the resistance of the tunnel barrier layer 33 of the TMR read head element has changed by damage due to spark at the bonding process. In such case, a degree of metallic conduction in the barrier layer is evaluated from the resistance change ratio VbdMRR(%). This evaluation is performed in this embodiment by judging whether the calculated resistance change ratio VbdMRR(%) is less than a predetermined threshold of −0.9 (%) or not, namely whether the ratio VbdMRR(%) is negative and its absolute value is more than 0.9 (%) or not. If the ratio VbdMRR(%) is less than the threshold of −0.9 (%), a degree of metallic conduction in the barrier layer is low and thus it is evaluated that this TMR read head element is non-defective product with a high element breakdown voltage. Whereas, if the ratio VbdMRR(%) is equal to or more than the threshold of −0.9 (%), bonding spark may inflict damage to the TMR read head element to provide a high metallic conduction in the barrier layer due to occurrence of pinholes, and thus it is evaluated that this TMR read head element is defective product with a low element breakdown voltage.

Thereafter, a final test process is performed (Step S17). At this final test process, for example a performance test such as an electromagnetic conversion performance test of the TMR read head element is performed.

The process of the above-mentioned Steps S14-S17 is the assembling process.

In this embodiment, the resistance of the TMR read head element measured just after the TMR read head element is fabricated in the wafer process is determined as the wafer process initial resistance $R_0$. This is because no damage will be occurred in the barrier layer of the TMR read head element at this stage, and thus this resistance measured just after fabrication of the TMR read head element is used as a reference value for comparison. Also, in the machining process and the assembling process, the resistance of the TMR read head element measured just after the MR height adjustment is performed is determined as the machining and assembling process initial resistance $R_0'$. This is because the resistances before and after the MR height adjustment greatly differ with each other, and thus this resistance measured just after the MR height adjustment is used as a reference value for comparison.

In modifications, only measurement of VbdMRR(%) may be executed at the aforementioned Steps S2, S4, S8, S10, S12 and S16. Furthermore, all of these Steps S2, S4, S8, S10, S12 and S16 may be unnecessary to execute, but in modifications a part of these Steps may be performed.

FIG. 5 schematically illustrates a configuration of testing the TMR read head element performed at Step S8 in the embodiment of FIG. 1.

In the figure, reference numeral 50 denotes the bar member with a plurality of aligned TMR read head elements that are not individually separated yet, and 51 denotes a testing apparatus of the TMR read head element.

Each TMR read head element 50a of the bar member 50 is provided with a TMR read head element, an inductive write head element, a pair of terminal pads 50b electrically connected to the TMR read head element, and a pair of terminal pads electrically connected to the inductive write head element.

The testing apparatus 51 has two pairs of probes 51a and 51b for the four-terminal measurement method, which can be electrically contact to the pair of terminal pads 50b of the TMR read head element, a constant current supply circuit 51c electrically connected to one pair of probes 51a, for feeding a constant current of known current values to the TMR read head element, a voltage measurement circuit 51d electrically connected to the other pair of probes 51b, for measuring output voltage from the TMR read head element, an analog to digital (A/D) converter 5Se electrically connected to the voltage measurement circuit 51d, for converting its analog output into digital signals, and a digital computer 51f electrically connected to the A/D converter 51e and the constant current supply circuit 51c. The digital computer 51f sequentially receives the digital signals from the A/D converter 51e and calculates resistance values at the respective sense currents fed to the TMR read head element so as to judge whether or not the TMR read head element is defective. Also, the digital computer 51f controls the operations of the constant current supply circuit 51c and the A/D converter 51e.

Figure 6:
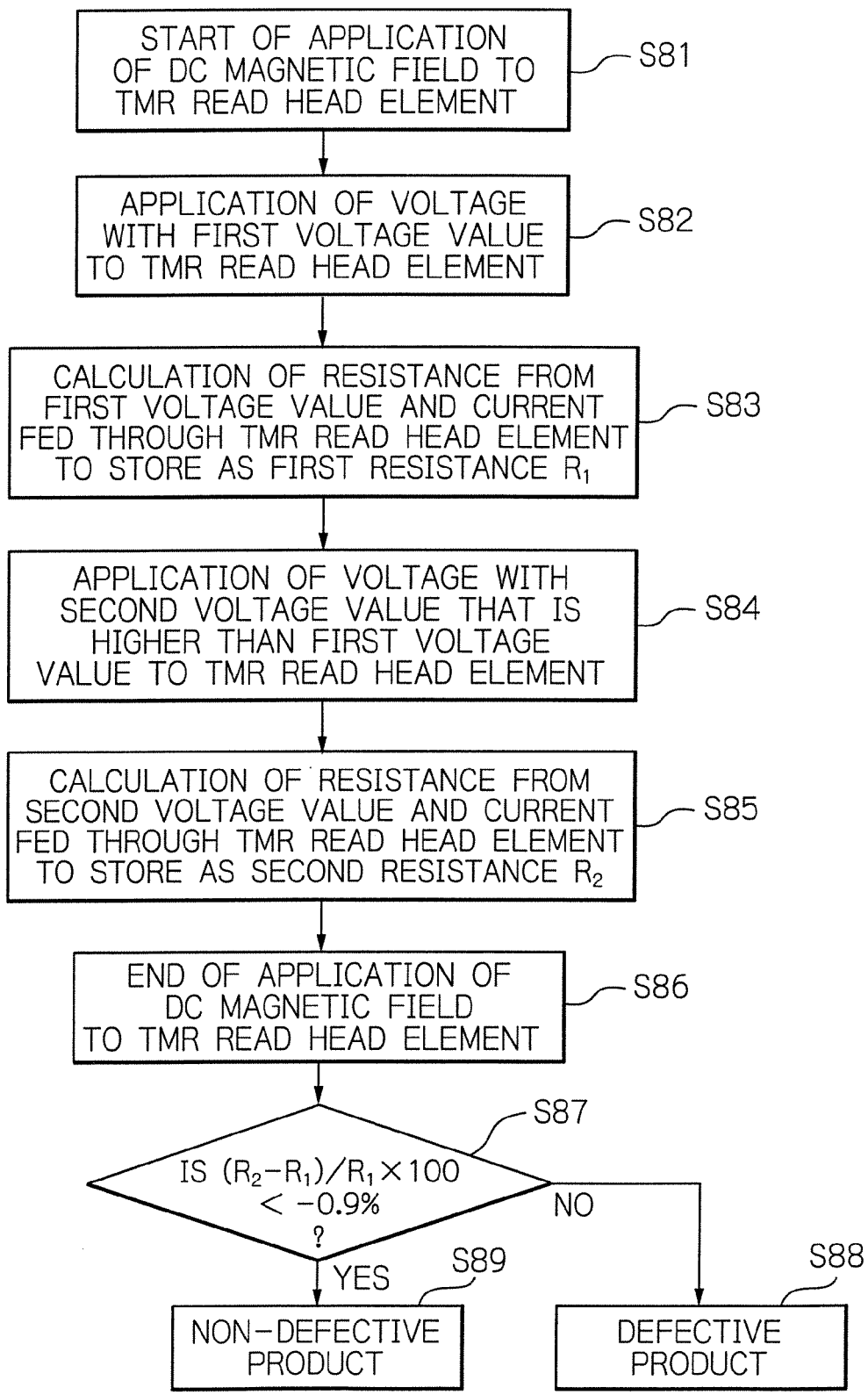
FIG. 6 is a flow chart illustrating a testing procedure of a testing apparatus in the embodiment of FIG. 1.

FIG. 6 illustrates a testing procedure of the testing apparatus 51 in this embodiment.

First, application of an external DC magnetic field from a DC magnetic field generation device (not shown) to the bar member 50 is started (Step S81). This applied DC magnetic field keeps the relationship between a magnetization direction in the pin layer of the TMR read head element and a magnetization direction in the free layer of the TMR read head element constant.

Then, the two pairs of probes 51a and 51b are brought into electrical contact with the terminal pads 50b of the TMR read head element to be tested in the bar member 50, and under this state a voltage with a first voltage value of 25 mV for example is applied (Step S82). Application of this voltage is performed by feeding a current with a known current value to the TMR read head element from the constant current supply circuit 51c, by monitoring the output voltage from the TMR read head element by the digital computer 51f through the voltage measurement circuit 51d, and by changing the current fed to the TMR read head element until the output voltage becomes the first voltage value such as for example 25 mV. In this case, the current fed from the constant current supply circuit 51c may be stepwise changed until the output voltage becomes the first voltage value, or the current may be continuously changed until the output voltage becomes the first voltage value.

Then, a resistance value of the TMR read head element is calculated using the Ohm's law from the first voltage value and the current value of current fed from the constant current supply circuit 51c when the first voltage is attained (Step S83). The calculated resistance value is stored in the computer 51f as a first resistance $R_1$. The calculated first resistance $R_1$ at this stage is also stored as a machining and assembling process initial resistance $R_0'$.

Then, a voltage with a second voltage value of 150 mV for example, which is higher than the first voltage value is applied to the TMR read head element (Step S84). Application of this voltage is performed by feeding a current with a known current value to the TMR read head element from the constant current supply circuit 51c, by monitoring the output voltage from the TMR read head element by the digital computer 51f through the voltage measurement circuit 51d, and by changing the current fed to the TMR read head element until the output voltage becomes the second voltage value such as for example 150 mV. In this case, the current fed from the constant current supply circuit 51c may be stepwise changed until the output voltage becomes the first voltage value, or the current may be continuously changed until the output voltage becomes the first voltage value.

Then, a resistance value of the TMR read head element is calculated using the Ohm's law from the second voltage value and the current value of current fed from the constant current supply circuit 51c when the second voltage is attained (Step S85). The calculated resistance value is stored in the computer 51f as a second resistance $R_2$.

Then, the application of the external DC magnetic field to the bar member 50 is ended (Step S86).

Thereafter, a ratio of change in resistance VbdMRR(%) is calculated from the first resistance $R_1$ and the second resistance $R_2$ using an equation of VbdMRR(%)=$(R_2-R_1)/R_1 \times 100$, and whether the calculated resistance change ratio VbdMRR(%) is less than a predetermined threshold of –0.9 (%) or not, namely whether the ratio VbdMRR(%) is negative and its absolute value is more than 0.9 (%) or not is judged (Step S87).

If yes, namely the ratio VbdMRR(%) is less than the threshold of –0.9 (%), it is evaluated that this TMR read head element is non-defective product with a high element breakdown voltage (Step S88). Whereas, if the ratio VbdMRR(%) is equal to or more than the threshold of –0.9 (%), it is evaluated that this TMR read head element is defective product with a low element breakdown voltage (Step S89).

Then, the remaining TMR read head elements in the bar member 50 are sequentially evaluated in the same manner.

Figure 7A:
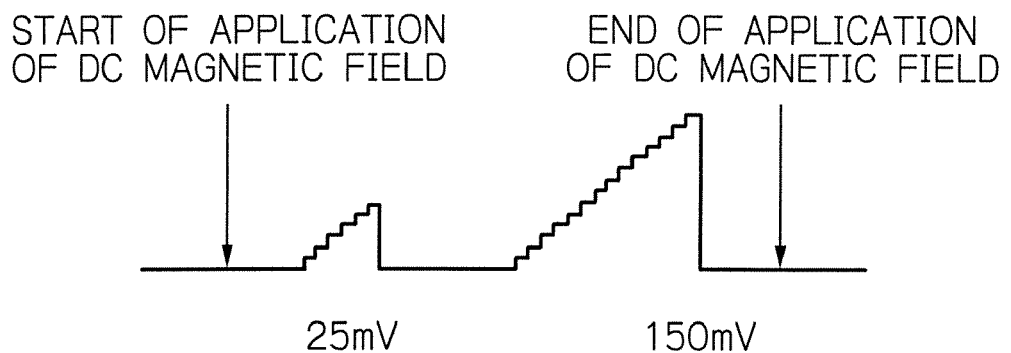
FIGS. 7a to 7c are current waveform views illustrating various sequences of the testing procedure of FIG. 6.
Figure 7B:
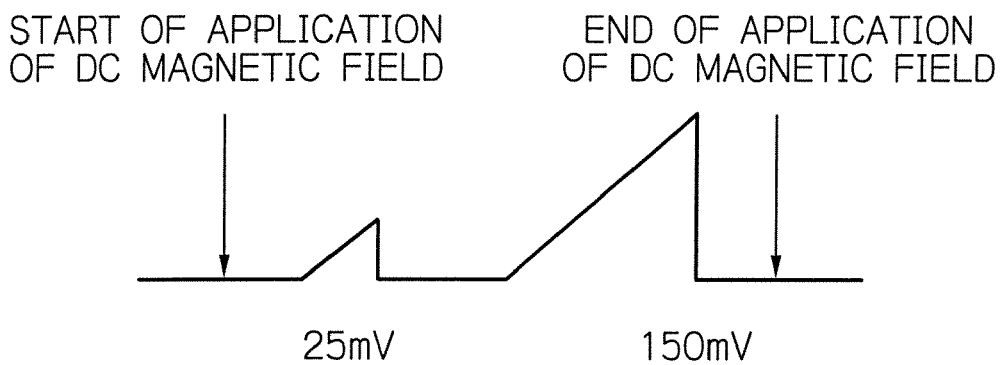
Figure 7C:
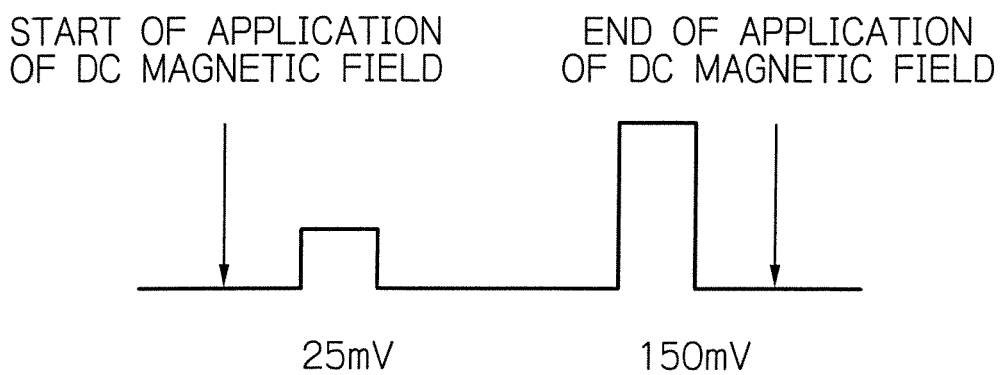

FIGS. 7a to 7c illustrate various sequences of the testing procedure of FIG. 6.

A case of stepwise changing the current fed to the TMR read head element as shown in FIG. 7a is now described. First, application of the DC magnetic field to the TMR read head element is started. Then, the current fed from the constant current supply circuit 51c is stepwise increased until the output voltage from the TMR read head element becomes the lower first voltage value of 25 mV for example.

The first resistance $R_1$ is obtained from the first voltage value and the current fed when the output voltage from the TMR read head element becomes the first voltage value. Then, the current fed from the constant current supply circuit 51c is further stepwise increased until the output voltage from the TMR read head element becomes the higher second voltage value of 150 mV for example. The second resistance $R_2$ is obtained from the second voltage value and the current fed when the output voltage from the TMR read head element becomes the second voltage value. Thereafter, the application of the DC magnetic field to the TMR read head element is ended. Then, the ratio of change in resistance VbdMRR (%) is calculated from VbdMRR(%)=$(R_2-R_1)/R_1 \times 100$. Defective/non-defective evaluation of the TMR read head element is performed whether the calculated resistance change ratio VbdMRR(%) is less than a predetermined threshold of −0.9 (%) or not. The duration of each applied voltage is optionally determined and also interval of the applied voltages is optionally determined.

A case of continuously changing the current fed to the TMR read head element as shown in FIG. 7b is now described. First, application of the DC magnetic field to the TMR read head element is started. Then, the current fed from the constant current supply circuit 51c is continuously increased until the output voltage from the TMR read head element becomes the lower first voltage value of 25 mV for example. The first resistance $R_1$ is obtained from the first voltage value and the current fed when the output voltage from the TMR read head element becomes the first voltage value. Then, the current fed from the constant current supply circuit 51c is further continuously increased until the output voltage from the TMR read head element becomes the higher second voltage value of 150 mV for example. The second resistance $R_2$ is obtained from the second voltage value and the current fed when the output voltage from the TMR read head element becomes the second voltage value. Thereafter, the application of the DC magnetic field to the TMR read head element is ended. Then, the ratio of change in resistance VbdMRR(%) is calculated from VbdMRR(%)=$(R_2-R_1)/R_1 \times 100$. Defective/non-defective evaluation of the TMR read head element is performed whether the calculated resistance change ratio VbdMRR(%) is less than a predetermined threshold of −0.9 (%) or not. The duration of each applied voltage is optionally determined and also interval of the applied voltages is optionally determined.

A case of measuring the current fed to the TMR read head element by a current meter as shown in FIG. 7c is now described. This sequence differs from that illustrated in FIG. 6. First, application of the DC magnetic field to the TMR read head element is started. Then, a rectangular shaped voltage with the lower first voltage value of 25 mV for example is applied to the TMR read head element and the current flowing at that time through the TMR read head element is measured by the current meter. The first resistance $R_1$ is obtained from the first voltage value and the current measured. Then, a rectangular shaped voltage with the higher second voltage value of 150 mV for example is applied to the TMR read head element and the current flowing at that time through the TMR read head element is measured by the current meter. The second resistance $R_2$ is obtained from the second voltage value and the current measured. Thereafter, the application of the DC magnetic field to the TMR read head element is ended. Then, the ratio of change in resistance VbdMRR(%) is calculated from VbdMRR(%)=$(R_2-R_1)/R_1 \times 100$. Defective/non-defective evaluation of the TMR read head element is performed whether the calculated resistance change ratio VbdMRR(%) is less than a predetermined threshold of −0.9 (%) or not. The duration of each applied voltage is optionally determined and also interval of the applied voltages is optionally determined.

Figure 8:
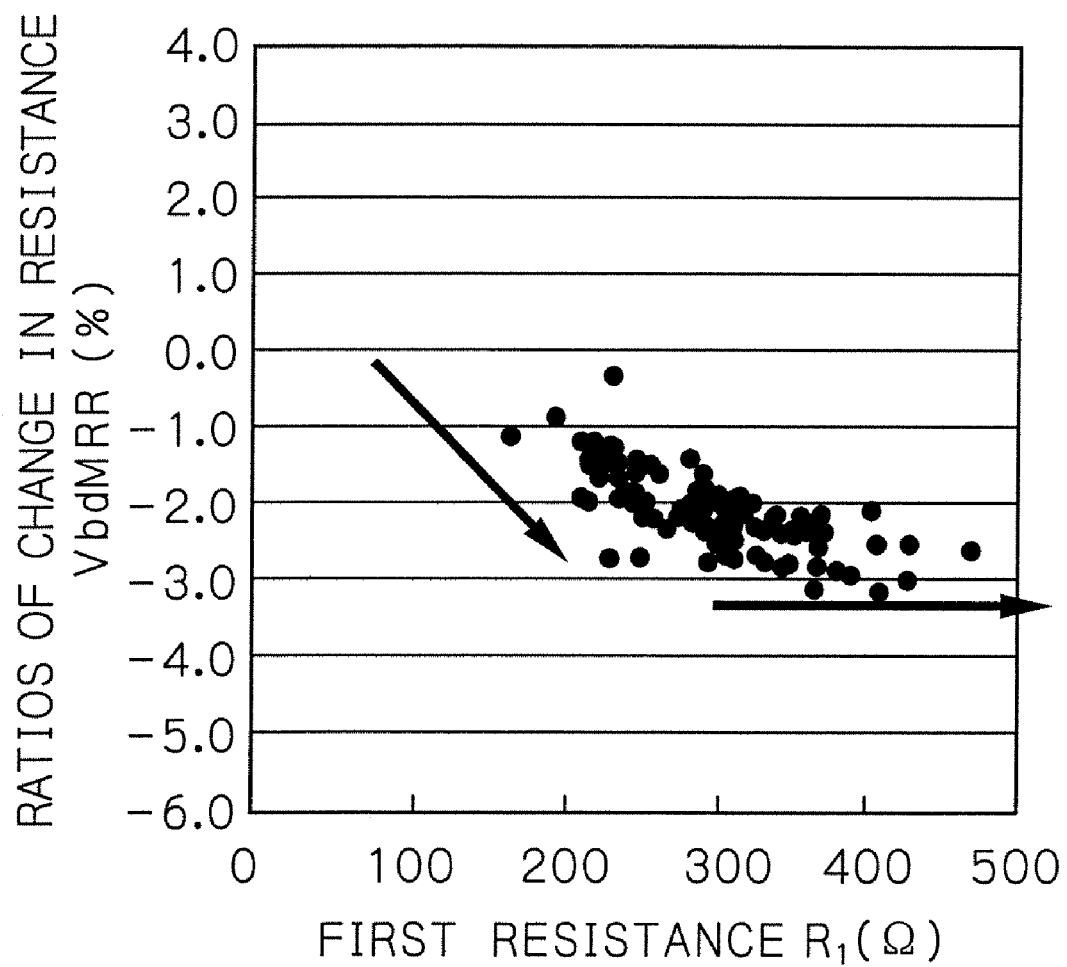
FIG. 8 is a graph illustrating a relationship between ratios of change in resistance VbdMRR(%) calculated from a measured and calculated first resistances $R_1$ when a voltage of 25 mV is applied and from a measured and calculated second resistances $R_2$ when a voltage of 150 mV is applied and the first resistances $R_1$, with respect to many TMR read head elements.

FIG. 8 illustrates resistance change ratios VbdMRR(%) thus calculated from the measured and calculated first resistances $R_1$ when the first voltage of 25 mV is applied and the measured and calculated second resistances $R_2$ when the second voltage of 150 mV is applied, with respect to many TMR read head elements. In the figure, the lateral axis represents the first resistance value $R_1$ (Ω) and the longitudinal axis represents the resistance change ratio VbdMRR (%).

As will be noted from the figure, the resistance change ratio VbdMRR(%) does not have a strong correlation with the first resistance value $R_1$ and is substantially separated into two groups with a boundary of the resistance of 250-300Ω. Namely, the resistance change ratio VbdMRR(%) does not have so strong correlation with the first resistance value $R_1$ and, when the ratio VbdMRR(%) approaches a certain value, no area effect due to the size of the tunnel barrier layer is obtained resulting that it becomes easier to evaluate whether the tunnel barrier layer of the TMR head element functions well or malfunctions. As a result, it is possible to clearly and certainly confirm a reliability of the TMR element without failing.

Figure 9:
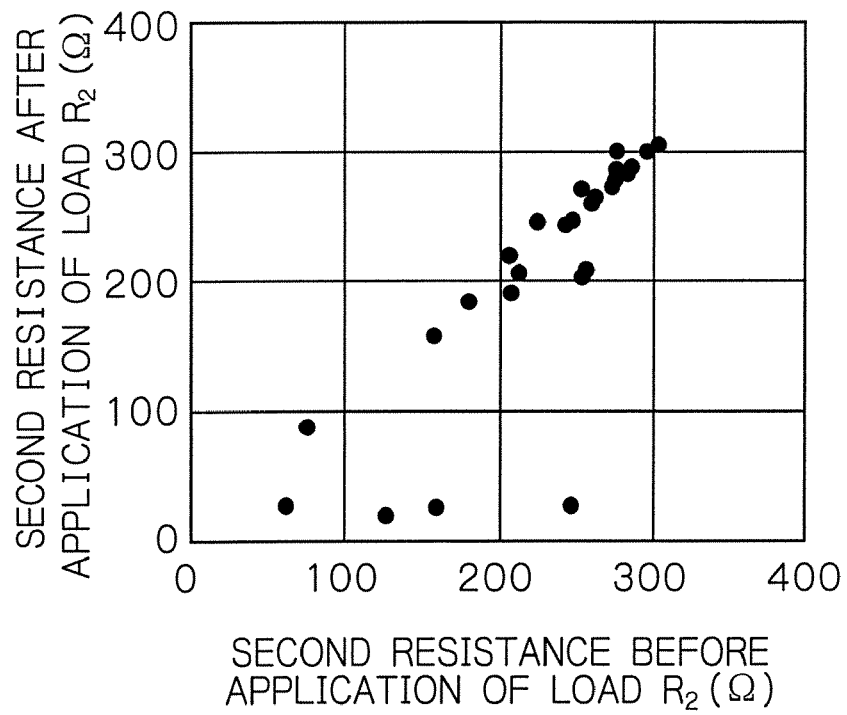
FIG. 9 is a graph illustrating a relationship between the second resistances $R_2$ before application of a load and the second resistances $R_2$ after application of the load, with respect to many TMR read head elements.
Figure 10:
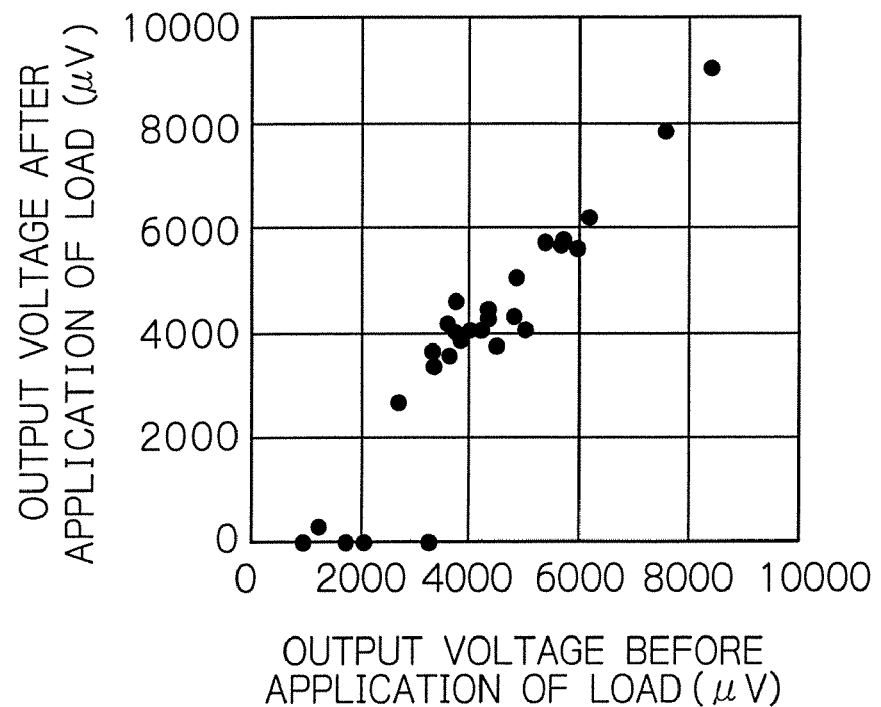
FIG. 10 is a graph illustrating a relationship between an output voltage before application of the load and an output voltage after application of the load, with respect to the same TMR read head elements in the case of FIG. 9.

FIG. 9 illustrates a relationship between the second resistances $R_2$ before application of a load and the second resistances $R_2$ after application of the load, with respect to many TMR read head elements, and FIG. 10 illustrates a relationship between an output voltage before application of the load and an output voltage after application of the load, with respect to the same TMR read head elements in the case of FIG. 9. The load in the cases is application of a voltage of 350 mV under the environment at 120° C. to shorten the load application period to 100 hours.

As shown in these figures, the second resistances $R_2$ of the output voltages of some TMR head elements become substantially zero by applying the load. These TMR head elements are considered as defective head elements with a low reliability.

Figure 11:
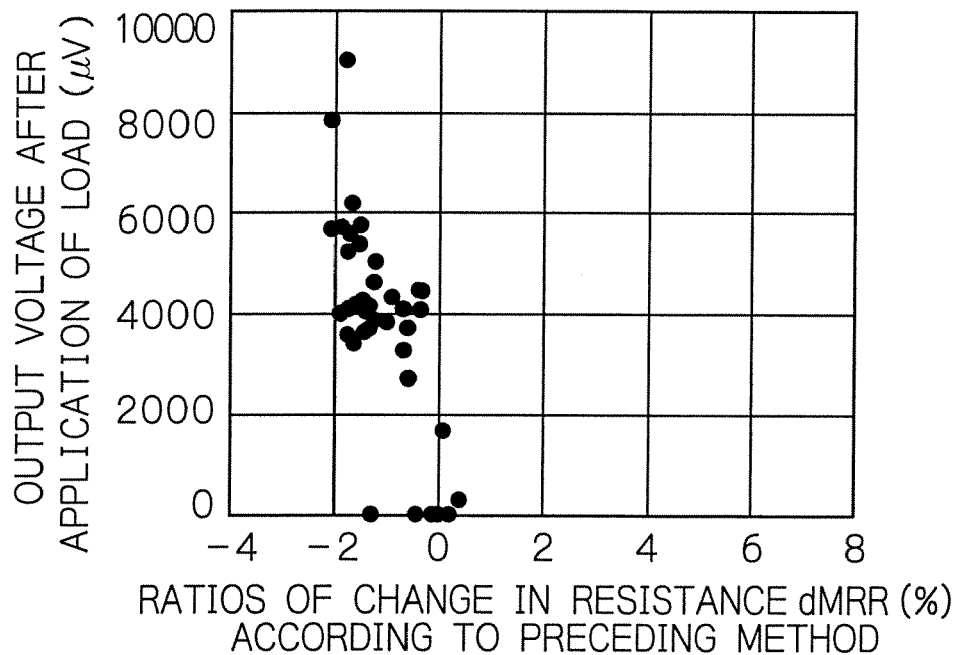
FIG. 11 is a graph illustrating a relationship between an output voltage after application of the load and ratios of change in resistance dMRR(%) according to the preceding method, with respect to the same TMR read head elements in the case of FIG. 9.
Figure 12:
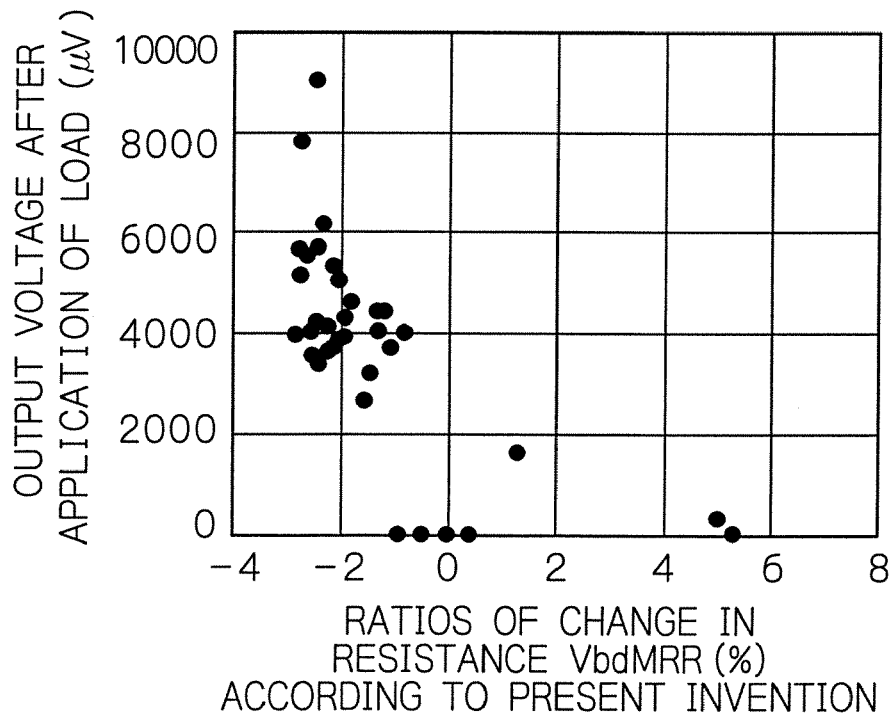
FIG. 12 is a graph illustrating a relationship between an output voltage after application of the load and ratios of change in resistance VbdMRR(%) according to the present invention, with respect to the same TMR read head elements in the case of FIG. 9.

FIG. 11 illustrates a relationship between an output voltage after application of the load and ratios of change in resistance dMRR(%) according to the preceding method (resistance change ratios obtained by feeding different value currents) with respect to the same TMR read head elements in the case of FIG. 9, and FIG. 12 illustrates a relationship between an output voltage after application of the load and ratios of change in resistance VbdMRR(%) according to the present invention with respect to the same TMR read head elements in the case of FIG. 9. In FIG. 11, the lateral axis represents the resistance change ratio dMRR(%) and the longitudinal axis represents the output voltage after application of the load. In FIG. 12, the lateral axis represents the resistance change ratio VbdMRR(%) and the longitudinal axis represents the output voltage after application of the load.

As will be noted from FIG. 11, some defective TMR head elements of which output voltages become zero by applying the load have low resistance change ratio dMRR(%). Thus, if evaluation is done by comparing the resistance change ratio dMRR(%) according to the preceding method with a threshold, it is difficult to certainly judge whether the evaluated TMR head elements are defective or non-defective. If the threshold is lowered to eliminate most of the defective head elements, many of non-defective TMR head elements may be also eliminated causing the manufacturing yield to greatly decrease.

Contrary to this, as will be understood from FIG. 12, few defective TMR head element of which output voltages becomes zero by applying the load has a resistance change ratio VbdMRR(%) less than −0.9 (%). Also, few non-defective TMR head element has resistance change ratio VbdMRR(%) equal to or more than −0.9 (%). Therefore, by comparing the resistance change ratio VbdMRR(%) with the threshold of −0.9 (%) according to the present invention, it is possible to perform defective/non-defective evaluation with reliability. Namely, it can be evaluated that the TMR read head elements with the resistance change ratios VbdMRR(%) less than −0.9 (%) are non-defective products with less pinhole in their barrier layers, and that the TMR read head elements with resistance change ratios VbdMRR(%) equal to or more than −0.9 (%) are defective products with pinholes in their barrier layers or with short-circuits around the barrier layers.

In the above-mentioned embodiment, the threshold of the resistance change ratio VbdMRR(%) is determined as −0.9 (%). This threshold is used under the condition that the tunnel barrier layer of the TMR read head element is made of oxide of aluminum, such as $Al_2O_3$ for example, the first voltage value is 25 mV, and the second voltage value is 150 mV. In case that the tunnel barrier layer of the TMR read head element is made of a material other than the oxide of aluminum, it is possible to similarly evaluate the TMR read head element by correspondingly determining a first voltage value and a second voltage value and a threshold of the resistance change ratio VbdMRR(%). In other words, the threshold of the resistance change ratio VbdMRR(%) is not limited to the above-mentioned value in this embodiment, but determined depending upon the specification of the TMR read head element.

Also, a first voltage value of the voltage applied to measure the first resistances $R_1$ and a second voltage value of the voltage applied to measure the second resistances $R_2$ are not limited to the aforementioned first and second voltage values, but may be arbitrary determined under the conditions that the absolute first and second voltage values are lower than the breakdown voltage of the TMR read head element and the absolute second voltage value is higher than the absolute first voltage value. For example, when the first voltage value is 25 mV, the second voltage value will be determined to a value higher than 25 mV but lower than the breakdown voltage value of the TMR read head element. Of course, the first voltage value may be determined to a value other than 25 mV. In modifications of this embodiment, a voltage with a second voltage value may be first applied to the TMR read head element, and thereafter a voltage with a first voltage value lower than the second voltage value may be applied to the TMR read head element.

The voltage is applied to the TMR read head element so that a current flows upward in the laminating direction of layers (from the substrate side or lower side to the anti-substrate side or upper side in the laminating direction) or that a current flows downward in the laminating direction (from the anti-substrate side or upper side to the substrate side or lower side in the laminating direction) of the TMR read head element irrespective of the laminated order of the TMR film.

As described above, according to this embodiment, the first resistance $R_1$ of the TMR read head element is calculated from the measured current flowing through the TMR read head element when the voltage with the first voltage value is applied thereto, the second resistance $R_2$ of the TMR read head element is calculated from the measured current flowing through the TMR read head element when the voltage with the second voltage value higher than the first voltage value is discontinuously applied thereto, the resistance change ratio VbdMRR(%) is calculated using the calculated first and second resistances $R_1$ and $R_2$ from VbdMRR(%)=$(R_2-R_1)/R_1 \times 100$, and the calculated resistance change ratio VbdMRR(%) is compared with the threshold. Therefore, evaluation test of non-defective and defective products can be extremely easily and quickly performed. Also, according to this embodiment, because this evaluation test can be performed without destroying the TMR read head element, 100% inspection of the manufactured TMR read head elements becomes possible. As a result, a reliability of the TMR element can be quickly and easily confirmed without failing, and thus it is extremely effective for mass-production. Particularly, because the constant voltages with the first voltage value and the second voltage value different from each other are applied to the TMR read head element, load applied to the different size tunnel barrier layers become equal to each other resulting that measurement and evaluation can be performed with keeping a load factor constant. Also, the measurement can be performed under the state closed to that in which the TMR read head elements are actually operated. As a result, non-defective/defective evaluation can be achieved only by comparing the resistance change ratio VbdMRR(%) with the threshold. Thus, it is possible to clearly and certainly confirm a reliability of the TMR read head element without failing. Furthermore, it is prevented from occurring decrease in the manufacturing yield.

Although the aforementioned embodiments concern the method and apparatus for testing the TMR read head element, it is apparent that the present invention can be similarly applied to a test of an MRAM cell.

Figure 13:
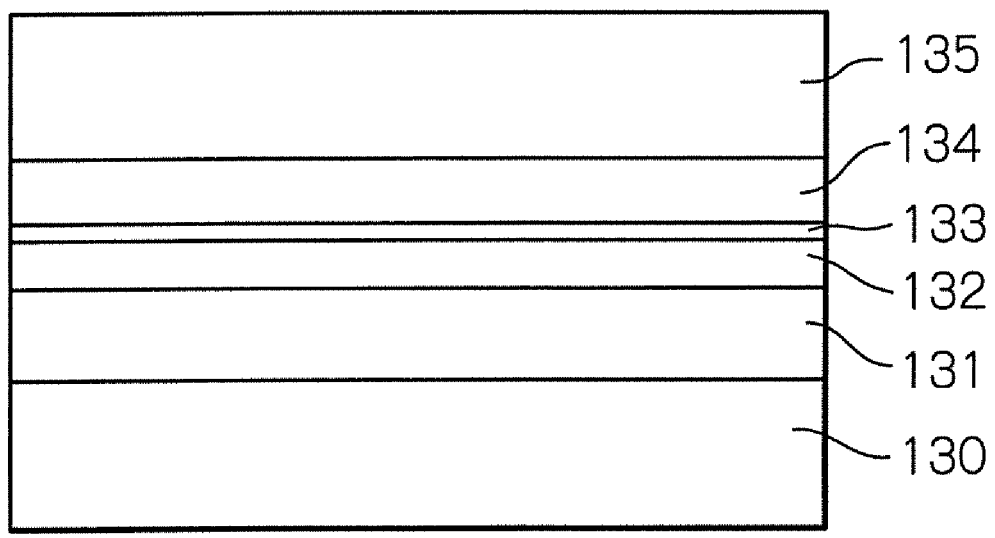
FIG. 13 is a sectional view illustrating a structure example of an MRAM cell fabricated in another embodiment according to the present invention.

FIG. 13 illustrates a structure example of an MRAM cell fabricated in another embodiment according to the present invention.

As shown in the figure, the MRAM cell has a TMR structure with an anti-ferromagnetic layer 131, a pinned layer 132, a tunnel barrier layer 133, a free layer 134 and an upper conductor layer 135 constituting a word line sequentially laminated on a lower conductor layer 130 constituting a bit line. A manufacturing method, a test method and a test apparatus in this embodiment, and also other configurations, operations and advantages in this embodiment are substantially similar to these in the embodiment of FIG. 1 except that this embodiment has no machining process nor test process for a bar member.

Many widely different embodiments of the present invention may be constructed without departing from the spirit and scope of the present invention. It should be understood that the present invention is not limited to the specific embodiments described in the specification, except as defined in the appended claims.

The invention claimed is:

1. A method for testing a tunnel magnetoresistive effect element comprising the steps of:
   measuring a plurality of resistances of said tunnel magnetoresistive effect element by applying a plurality of discontinuous voltages with different voltage values from each other to said tunnel magnetoresistive effect element, respectively;
   calculating a ratio of change in resistance from the measured plurality of resistances of said tunnel magnetoresistive effect element; and evaluating said tunnel magnetoresistive effect element using the calculated ratio of change in resistance.

2. The method as claimed in claim 1, wherein the measuring step comprises measuring two resistances of said tunnel magnetoresistive effect element by applying two voltages with different voltage values from each other to said tunnel magnetoresistive effect element, and wherein the calculating step comprises calculating a ratio of change in resistance from a difference between the measured two resistances of said tunnel magnetoresistive effect element.

3. A method for testing a tunnel magnetoresistive effect element comprising the steps of:
measuring a first resistance of said tunnel magnetoresistive effect element by applying a voltage with a first voltage value to said tunnel magnetoresistive effect element, and a second resistance of said tunnel magnetoresistive effect element by applying a voltage with a second voltage value of which absolute value is greater than that of the first voltage value to said tunnel magnetoresistive effect element,
the voltage with said second voltage value being discontinuous with the voltage with said first voltage value;
calculating a ratio of change in resistance from the measured first and second resistances of said tunnel magnetoresistive effect element; and
evaluating said tunnel magnetoresistive effect element using the calculated ratio of change in resistance.

4. The method as claimed in claim 3, wherein the calculating step comprises calculating the ratio of change in resistance from a difference between said measured first and second resistances.

5. The method as claimed in claim 3, wherein the calculating step comprises calculating the ratio of change in resistance from an expression of $(R_2-R_1)/R_1 \times 100$ (%), where said first resistance is indicated by $R_1$ and said second resistance is indicated by $R_2$.

6. The method as claimed in claim 5, wherein the evaluating step comprises evaluating said tunnel magnetoresistive effect element as a non-defective product when the calculated ratio of change in resistance $(R_2-R_1)/R_1 \times 100$ (%) is less than a predetermined threshold.

7. The method as claimed in claim 6, wherein said tunnel magnetoresistive effect element has a tunnel barrier layer made of an oxide of aluminum, wherein the measuring step comprises applying the voltage with the first voltage value of 25 mV to said tunnel magnetoresistive effect element, and applying the voltage with the second voltage value of 150 mV to said tunnel magnetoresistive effect element, and wherein said predetermined threshold is −0.9 (%).

8. The method as claimed in claim 3, wherein the measuring step comprises applying an external DC magnetic field in a predetermined direction to said tunnel magnetoresistive effect element so that the measuring step is performed under the applied external DC magnetic field.

9. The method as claimed in claim 3, wherein said tunnel magnetoresistive effect element is a tunnel magnetoresistive effect head element.

10. The method as claimed in claim 3, wherein said tunnel magnetoresistive effect element is a magnetoresistive effect random access memory cell.

11. An apparatus for testing a tunnel magnetoresistive effect element comprising:
means for measuring a first resistance of said tunnel magnetoresistive effect element by applying a voltage with a first voltage value to said tunnel magnetoresistive effect element, and a second resistance of said tunnel magnetoresistive effect element by applying a voltage with a second voltage value of which absolute value is greater than that of the first voltage value to said tunnel magnetoresistive effect element, the voltage with said second voltage value being discontinuous with the voltage with said first voltage value;
means for calculating a ratio of change in resistance from the measured first and second resistances of said tunnel magnetoresistive effect element; and
means for evaluating said tunnel magnetoresistive effect element using the calculated ratio of change in resistance.

12. The apparatus as claimed in claim 11, wherein the calculating means comprises means for calculating the ratio of change in resistance from a difference between said measured first and second resistances.

13. The apparatus as claimed in claim 11, wherein the calculating means comprises means for calculating the ratio of change in resistance from an expression of $(R_2-R_1)/R_1 \times 100$ (%), where said first resistance is indicated by $R_1$ and said second resistance is indicated by $R_2$.

14. The apparatus as claimed in claim 13, wherein the evaluating means comprises means for evaluating said tunnel magnetoresistive effect element as a non-defective product when the calculated ratio of change in resistance $(R_2-R_1)/R_1 \times 100$ (%) is less than a predetermined threshold.

15. The apparatus as claimed in claim 14, wherein said tunnel magnetoresistive effect element has a tunnel barrier layer made of an oxide of aluminum, wherein the measuring means comprises means for applying the voltage with the first voltage value of 25 mV to said tunnel magnetoresistive effect element, and applying the voltage with the second voltage value of 150 mV to said tunnel magnetoresistive effect element, and wherein said predetermined threshold is −0.9 (%).

16. The apparatus as claimed in claim 11, wherein the measuring means comprises means for applying an external DC magnetic field in a predetermined direction to said tunnel magnetoresistive effect element so that the measurement is performed under the applied external DC magnetic field.

17. The apparatus as claimed in claim 11, wherein said tunnel magnetoresistive effect element is a tunnel magnetoresistive effect head element.

18. The apparatus as claimed in claim 11, wherein said tunnel magnetoresistive effect element is a magnetoresistive effect random access memory cell.

19. A manufacturing method of a tunnel magnetoresistive effect element comprising:
a wafer process for forming many thin-film tunnel magnetoresistive effect elements on a wafer;
a cut process for cutting said wafer into a plurality of bar members, each of said bar members having the aligned tunnel magnetoresistive effect elements;
a measurement process for measuring a first resistance of the tunnel magnetoresistive effect element to be tested on said bar member by applying a voltage with a first voltage value to said tunnel magnetoresistive effect element, and a second resistance of said tunnel magnetoresistive effect element by applying a voltage with a second voltage value of which absolute value is greater than that of the first voltage value to said tunnel magnetoresistive effect element, the voltage with said second voltage value being discontinuous with the voltage with said first voltage value;
a calculation process for calculating a ratio of change in resistance from the measured first and second resistances of each tunnel magnetoresistive effect element;

an evaluation process for evaluating each tunnel magnetoresistive effect element using the calculated ratio of change in resistance; and a separation process for cutting the evaluated bar member into individual magnetic head sliders, each individual magnetic head slider having said tunnel magnetoresistive effect element.

20. The manufacturing method as claimed in claim 19, wherein the calculation process comprises calculating the ratio of change in resistance from a difference between said measured first and second resistances.

21. The manufacturing method as claimed in claim 19, wherein the calculation process comprises calculating the ratio of change in resistance from an expression of $(R_2-R_1)/R_1 \times 100$ (%), where said first resistance is indicated by $R_1$ and said second resistance is indicated by $R_2$.

22. The manufacturing method as claimed in claim 21, wherein the evaluation process comprises evaluating said tunnel magnetoresistive effect element as a non-defective product when the calculated ratio of change in resistance $(R_2-R_1)/R_1 \times 100$ (%) is less than a predetermined threshold.

23. The manufacturing method as claimed in claim 22, wherein said tunnel magnetoresistive effect element has a tunnel barrier layer made of an oxide of aluminum, wherein the measurement process comprises applying the voltage with the first voltage value of 25 mV to said tunnel magnetoresistive effect: element, and applying the voltage with the second voltage value of 150 mV to said tunnel magnetoresistive effect element, and wherein said predetermined threshold is −0.9 (%).

24. The manufacturing method as claimed in claim 19, wherein the measurement process comprises applying an external DC magnetic field in a predetermined direction to said tunnel magnetoresistive effect element so that the measurement process is performed under the applied external DC magnetic field.

25. The manufacturing method as claimed in claim 19, wherein said tunnel magnetoresistive effect element is a tunnel magnetoresistive effect head element.

26. The manufacturing method as claimed in claim 19, wherein said tunnel magnetoresistive effect element is a magnetoresistive effect random access memory cell.

27. A manufacturing method of a tunnel magnetoresistive effect element comprising:

a wafer process for forming many thin-film tunnel magnetoresistive effect elements on a wafer;

a measurement process for measuring a first resistance of the tunnel magnetoresistive effect element to be tested on said wafer by applying a voltage with a first voltage value to said tunnel magnetoresistive effect element, and a second resistance of said tunnel magnetoresistive effect element by applying a voltage with a second voltage value of which absolute value is greater than that of the first voltage value to said tunnel magnetoresistive effect element, the voltage with said second voltage value being discontinuous with the voltage with said first voltage value;

a calculation process for calculating a ratio of change in resistance from the measured first and second resistances of each tunnel magnetoresistive effect element;

an evaluation process for evaluating each tunnel magnetoresistive effect element using the calculated ratio of change in resistance;

a cut process for cutting the evaluated wafer into a plurality of bar members, each of said bar members having the aligned tunnel magnetoresistive effect elements; and a separation process for cutting each bar member into individual magnetic head sliders, each individual magnetic head slider having said tunnel magnetoresistive effect element.

28. The manufacturing method as claimed in claim 27, wherein the calculation process comprises calculating the ratio of change in resistance from a difference between said measured first and second resistances.

29. The manufacturing method as claimed in claim 27, wherein the calculation process comprises calculating the ratio of change in resistance from an expression of $(R_2-R_1)/R_1 \times 100$ (%), where said first resistance is indicated by R1 and said second resistance is indicated by $R_2$.

30. The manufacturing method as claimed in claim 29, wherein the evaluation process comprises evaluating said tunnel magnetoresistive effect element as a non-defective product when the calculated ratio of change in resistance $(R_2-R_1)/R_1 \times 100$ (%) is less than a predetermined threshold.

31. The manufacturing method as claimed in claim 30, wherein said tunnel magnetoresistive effect element has a tunnel barrier layer made of an oxide of aluminum, wherein the measurement process comprises applying the voltage with the first voltage value of 25 mV to said tunnel magnetoresistive effect element, and applying the voltage with the second voltage value of 150 mV to said tunnel magnetoresistive effect element. and wherein said predetermined threshold is −0.9 (%).

32. The manufacturing method as claimed in claim 27, wherein the measurement process comprises applying an external DC magnetic field in a predetermined direction to said tunnel magnetoresistive effect element so that the measurement process is performed under the applied external DC magnetic field.

33. The manufacturing method as claimed in claim 27, wherein said tunnel magnetoresistive effect element is a tunnel magnetoresistive effect head element.

34. The manufacturing method as claimed in claim 27, wherein said tunnel magnetoresistive effect element is a magnetoresistive effect random access memory cell.

35. A manufacturing method of a tunnel magnetoresistive effect element comprising:

a wafer process for forming many thin-film tunnel magnetoresistive effect elements on a wafer;

a cut process for cutting said wafer into a plurality of bar members, each of said bar members having the aligned tunnel magnetoresistive effect elements;

a separation process for cutting each of said bar members into individual magnetic head sliders, each individual magnetic head slider having said tunnel magnetoresistive effect element;

a measurement process for measuring a first resistance of the tunnel magnetoresistive effect element to be tested by applying a voltage with a first voltage value to said tunnel magnetoresistive effect element, and a second resistance of said tunnel magnetoresistive effect element by applying a voltage with a second voltage value of which absolute value is greater than that of the first voltage value to said tunnel magnetoresistive effect element the voltage with said second voltage value being discontinuous with the voltage with said first voltage value;

a calculation process for calculating a ratio of change in resistance from the measured first and second resistances of said tunnel magnetoresistive effect element; and an evaluation process for evaluating said tunnel magnetoresistive effect element using the calculated ratio of change in resistance.

36. The manufacturing method as claimed in claim 35, wherein the calculation process comprises calculating the ratio of change in resistance from a difference between said measured first and second resistances.

37. The manufacturing method as claimed in claim 35, wherein the calculation process comprises calculating the ratio of change in resistance from an expression of $(R_2-R_1)/R_1 \times 100$ (%), where said first resistance is indicated by $R_1$ and said second resistance is indicated by $R_2$.

38. The manufacturing method as claimed in claim 37, wherein the evaluation process comprises evaluating said tunnel magnetoresistive effect element as a non-defective product when the calculated ratio of change in resistance $(R_2-R_1)/R_1 \times 100$ (%) is less than a predetermined threshold.

39. The manufacturing method as claimed in claim 38, wherein said tunnel magnetoresistive effect element has a tunnel barrier layer made of an oxide of aluminum, wherein the measurement process comprises applying the voltage with the first voltage value of 25 mV to said tunnel magnetoresistive effect element, and applying the voltage with the second voltage value of 150 mV to said tunnel magnetoresistive effect element, and wherein said predetermined threshold is −0.9 (%).

40. The manufacturing method as claimed in claim 35, wherein the measurement process comprises applying an external DC magnetic field in a predetermined direction to said tunnel magnetoresistive effect element so that the measurement process is performed under the applied external DC magnetic field.

41. The manufacturing method as claimed in claim 35, wherein said tunnel magnetoresistive effect element is a tunnel magnetoresistive effect head element.

42. The manufacturing method as claimed in claim 35, wherein said tunnel magnetoresistive effect element is a magnetoresistive effect random access memory cell.

43. A tunnel magnetoresistive effect element manufactured by a method of a comprising:
   a wafer process for forming many thin-film tunnel magnetoresistive effect elements on a wafer;
   a cut process for cutting said wafer into a plurality of bar members, each of said bar members having the aligned tunnel magnetoresistive effect elements;
   a measurement process for measuring a first resistance of the tunnel magnetoresistive effect element to be tested on said bar member by applying a voltage with a first voltage value to said tunnel magnetoresistive effect element, and a second resistance of said tunnel magnetoresistive effect element by applying a voltage with a second voltage value of which absolute value is greater than that of the first voltage value to said tunnel magnetoresistive effect element, the voltage with said second voltage value being discontinuous with the voltage with said first voltage value;
   a calculation process for calculating a ratio of change in resistance from the measured first and second resistances of each tunnel magnetoresistive effect element;
   an evaluation process for evaluating each tunnel magnetoresistive effect element using the calculated ratio of change in resistance; and
   a separation process for cutting the evaluated bar member into individual magnetic head sliders, each individual magnetic head slider having said tunnel magnetoresistive effect element.

44. The tunnel magnetoresistive effect element as claimed in claim 43, wherein said tunnel magnetoresistive effect element has a tunnel barrier layer made of an oxide of aluminum.

45. A tunnel magnetoresistive effect element manufactured by a method of a comprising:
   a wafer process for forming many thin-film tunnel magnetoresistive effect elements on a wafer;
   a measurement process for measuring a first resistance of the tunnel magnetoresistive effect element to be tested on said wafer by applying a voltage with a first voltage value to said tunnel magnetoresistive effect element, and a second resistance of said tunnel magnetoresistive effect element by applying a voltage with a second voltage value of which absolute value is greater than that of the first voltage value to said tunnel magnetoresistive effect element, the voltage with said second voltage value being discontinuous with the voltage with said first voltage value;
   a calculation process for calculating a ratio of change in resistance from the measured first and second resistances of each tunnel magnetoresistive effect element;
   an evaluation process for evaluating each tunnel magnetoresistive effect element using the calculated ratio of change in resistance;
   a cut process for cutting the evaluated wafer into a plurality of bar members, each of said bar members having the aligned tunnel magnetoresistive effect elements; and
   a separation process for cutting each bar member into individual magnetic head sliders, each individual magnetic head slider having said tunnel magnetoresistive effect element.

46. The tunnel magnetoresistive effect element as claimed in claim 45, wherein said tunnel magnetoresistive effect element has a tunnel barrier layer made of an oxide of aluminum.

47. A tunnel magnetoresistive effect element manufactured by a method of a comprising:
   a wafer process for forming many thin-film tunnel magnetoresistive effect elements on a wafer;
   a cut process for cutting said wafer into a plurality of bar members, each of said bar members having the aligned tunnel magnetoresistive effect elements;
   a separation process for cutting each of said bar members into individual magnetic head sliders, each individual magnetic head slider having said tunnel magnetoresistive effect element;
   a measurement process for measuring a first resistance of the tunnel magnetoresistive effect element to be tested by applying a voltage with a first voltage value to said tunnel magnetoresistive effect element, and a second resistance of said tunnel magnetoresistive effect element by applying a voltage with a second voltage value of which absolute value is greater than that of the first voltage value to said tunnel magnetoresistive effect element the voltage with said second voltage value being discontinuous with the voltage with said first voltage value;

a calculation process for calculating a ratio of change in resistance from the measured first and second resistances of said tunnel magnetoresistive effect element; and an evaluation process for evaluating said tunnel magnetoresistive effect element using the calculated ratio of change in resistance.

48. The tunnel magnetoresistive effect element as claimed in claim 47, wherein said tunnel magnetoresistive effect element has a tunnel barrier layer made of an oxide of aluminum.

* * * * *